US008175543B2

(12) United States Patent
Rofougaran et al.

(10) Patent No.: US 8,175,543 B2
(45) Date of Patent: *May 8, 2012

(54) METHOD AND SYSTEM FOR WIRELESS COMMUNICATION USING INTEGRATED CLOCK GENERATION FOR BLUETOOTH AND FM TRANSMIT AND FM RECEIVE FUNCTIONS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1166 days.

This patent is subject to a terminal disclaimer.

(21) Appl. No.: 11/754,481

(22) Filed: May 29, 2007

(65) Prior Publication Data

US 2008/0233891 A1 Sep. 25, 2008

Related U.S. Application Data

(60) Provisional application No. 60/895,698, filed on Mar. 19, 2007.

(51) Int. Cl.
*H04B 1/40* (2006.01)
(52) U.S. Cl. .......................................... 455/76; 455/77

(58) Field of Classification Search ............... 455/76, 455/183.1, 260, 265, 255, 165.1, 147, 552.1–553.1, 455/556.1, 77, 41.2; 375/376, 344, 373, 375/375, 307; 327/156, 105, 47, 17–18; 331/158, 175, 25; 332/127, 117
See application file for complete search history.

(56) References Cited

U.S. PATENT DOCUMENTS 6,960,962 B2 * 11/2005 Peterzell et al. ............... 331/40
7,548,742 B2 * 6/2009 Johnson ...................... 455/313

* cited by examiner

*Primary Examiner* — Nay A Maung
*Assistant Examiner* — Angelica Perez
(74) *Attorney, Agent, or Firm* — Farjami & Farjami LLP

(57) ABSTRACT

A method and system for wireless communication using integrated clock generation for Bluetooth and FM transmit and FM receive functions may include generating a clock signal to enable transmission and/or reception of Bluetooth signals; and clocking a Direct Digital Frequency Synthesizer (DDFS) via the generated clock signal to generate one or more signals by the DDFS that enable transmission or reception of FM signals. The generated clock signals for the Bluetooth and for the FM transmit and receive functions may include an in phase and quadrature phase component. Time Division Duplex of FM transmission and reception and simultaneous FM transmission and FM reception may be simulated by switching the control frequency word at a certain rate. The DDFS may also receive control words to compensate for frequency changes in the Bluetooth LO. The FM signals reception and transmission may be controlled by a bi-directional coupler.

30 Claims, 6 Drawing Sheets

METHOD AND SYSTEM FOR WIRELESS COMMUNICATION USING INTEGRATED CLOCK GENERATION FOR BLUETOOTH AND FM TRANSMIT AND FM RECEIVE FUNCTIONS

CROSS-REFERENCE TO RELATED APPLICATIONS/INCORPORATION BY REFERENCE

This application makes reference to, claims priority to, and claims the benefit of U.S. Provisional Application Ser. No. 60/895,698 filed on Mar. 19, 2007.

This application also makes reference to:
U.S. application Ser. No. 11/286,555 filed on Nov. 22, 2005.
U.S. application Ser. No. 11/754,460 filed on May 27, 2009;
U.S. application Ser. No. 11/754,581 filed on May 27, 2009;
U.S. application Ser. No. 11/754,621 filed on May 27, 2009;
U.S. application Ser. No. 11/754,490 filed on May 27, 2009;
U.S. application Ser. No. 11/754,708 filed on May 27, 2009;
U.S. application Ser. No. 11/754,768 filed on May 27, 2009;
U.S. application Ser. No. 11/754,705 filed on May 27, 2009;
U.S. application Ser. No. 11/754,600 filed on May 27, 2009;
U.S. application Ser. No. 11/754,407 filed on May 27, 2009; and
U.S. application Ser. No. 11/754,438 filed on May 27, 2009.

Each of the above stated application is hereby incorporated herein by reference in its entirety.

FIELD OF THE INVENTION

Certain embodiments of the invention relate to wireless communication. More specifically, certain embodiments of the invention relate to a method and system for wireless communication using integrated clock generation for Bluetooth, FM transmit and FM receive functions.

BACKGROUND OF THE INVENTION

With the popularity of portable electronic devices and wireless devices that support audio applications, there is a growing need to provide a simple and complete solution for audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via broadcast communication, for example.

However, integrating multiple audio communication technologies into a single device may be costly. Combining a plurality of different communication services into a portable electronic device or a wireless device may require separate processing hardware and/or separate processing software. Moreover, coordinating the reception and/or transmission of data to and/or from the portable electronic device or a wireless device that uses FM transceivers may require significant processing overhead that may impose certain operation restrictions and/or design challenges. For example, a handheld device such as a cellphone that incorporates Bluetooth and Wireless LAN may pose certain coexistence problems caused by the close proximity of the Bluetooth and WLAN transceivers.

Furthermore, simultaneous use of a plurality of radios in a handheld may result in significant increases in power consumption. Power being a precious commodity in most wireless mobile devices, combining devices such as a cellular radio, a Bluetooth radio and a WLAN radio requires careful design and implementation in order to minimize battery usage. Additional overhead such as sophisticated power monitoring and power management techniques are required in order to maximize battery life.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for wireless communication is provided for integrating clock generation for Bluetooth and FM transmit and receive functions, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION

Certain embodiments of the invention may be found in a method and system for wireless communication using integrated clock generation for Bluetooth and FM transmit and FM receive functions. In an aspect of the invention, an integrated clock generator may function as a Bluetooth local oscillator (LO) generating in phase and quadrature phase clock signals to enable Bluetooth signals transmission and reception. The same clock signals may be used to drive a direct digital frequency synthesizer (DDFS) to generate FM LO clock signals to enable FM signals transmission or reception. The integrated clock generator may comprise of a phase locked loop circuit to maintain frequency stability. The FM LO clock signals may be controlled and adjusted by a frequency word. Time Division Duplex of FM transmission and reception may be achieved by switching between two control words in successive time intervals. A simultaneous FM transmission and FM reception may be simulated by switching the control frequency word at a certain rate. The DDFS may also receive control words to compensate for frequency changes in the Bluetooth LO. The reception and transmission of FM signals may be controlled by a bi-directional coupler. The integrated clock generator, the phase locked loop circuit and the DDFS may be integrated on a single chip or implemented using discrete components.

Figure 1A:
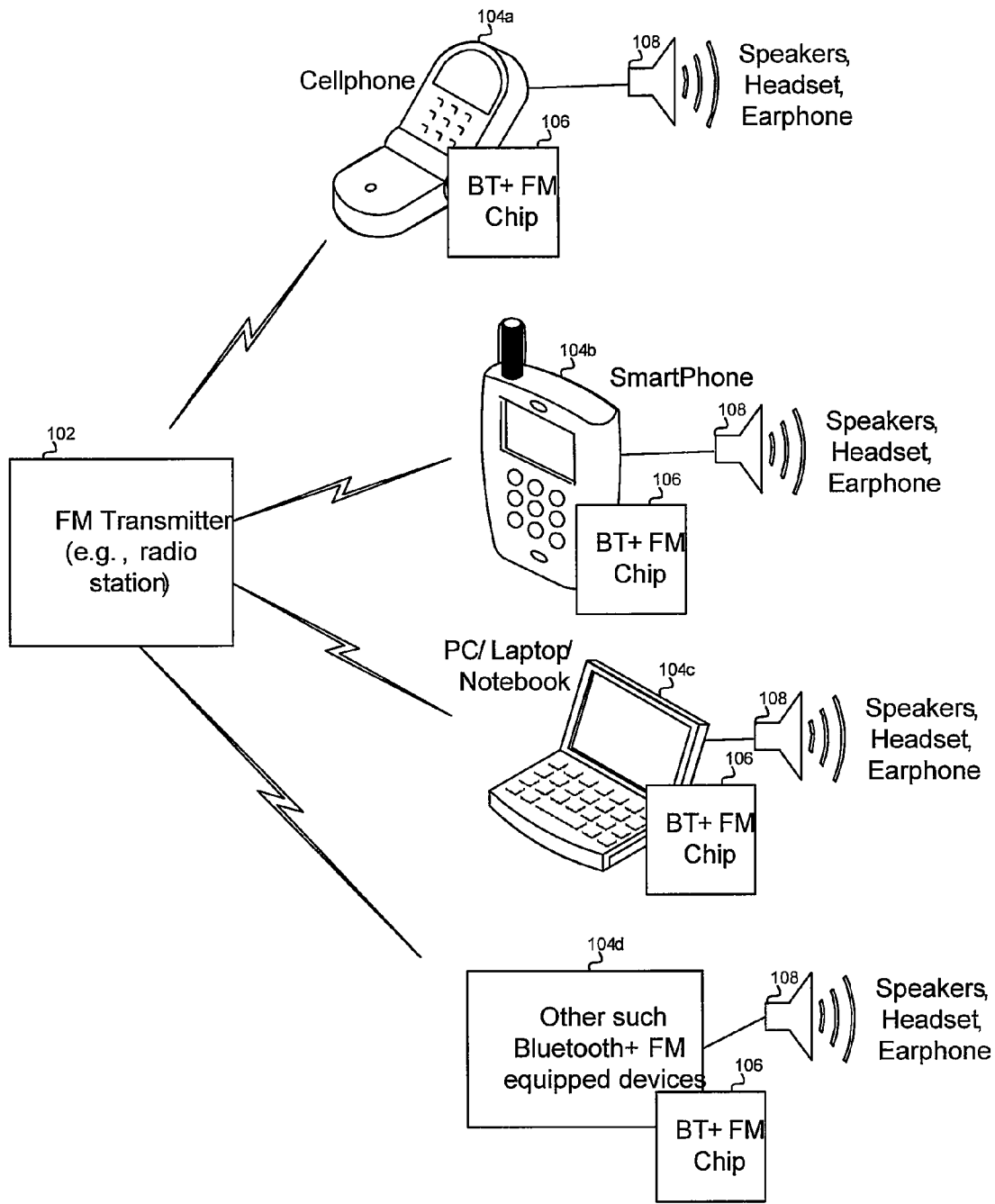
FIG. 1A is a block diagram of an exemplary integrated Bluetooth and FM transmitter that communicates with devices with FM receivers, in accordance with an embodiment of the invention.

FIG. 1A is a block diagram of an exemplary integrated Bluetooth and FM transmitter that communicates with handheld devices that utilize a single chip with integrated Bluetooth and FM radios, in accordance with an embodiment of the invention. Referring to FIG. 1A, there is shown an FM transmitter 102, a cellular phone 104a, a smart phone 104b, a computer 104c, and an exemplary FM and Bluetooth-equipped device 104d. The FM transmitter 102 may be implemented as part of a radio station or other broadcasting device, for example. Each of the cellular phone 104a, the smart phone 104b, the computer 104c, and the exemplary FM and Bluetooth-equipped device 104d may comprise a single chip 106 with integrated Bluetooth and FM radios for supporting FM and Bluetooth data communications. The FM transmitter 102 may enable communication of FM audio data to the devices shown in FIG. 1A by utilizing the single chip 106. Each of the devices in FIG. 1A may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices have been shown in FIG. 1A, the single chip 106 may be utilized in a plurality of other devices and/or systems that receive and use Bluetooth and/or FM signals. In one embodiment of the invention, the single chip Bluetooth and FM radio may be utilized in a system comprising a WLAN radio. The U.S. application Ser. No. 11/286,844, filed on Nov. 22, 2005, discloses a method and system comprising a single chip Bluetooth and FM radio integrated with a wireless LAN radio, and is hereby incorporated herein by reference in its entirety.

The single chip 106 may comprise of an integrated clock generator, (to be discussed in FIG. 2), where the integrated clock generator may both function as a Bluetooth local oscillator (LO) and as a FM LO. The Bluetooth LO may generate clock signals to enable Bluetooth signals transmission and reception. The same Bluetooth LO clock signals may be used to drive a direct digital frequency synthesizer (DDFS) to generate FM LO clock signals to enable FM signals reception.

Figure 1B:
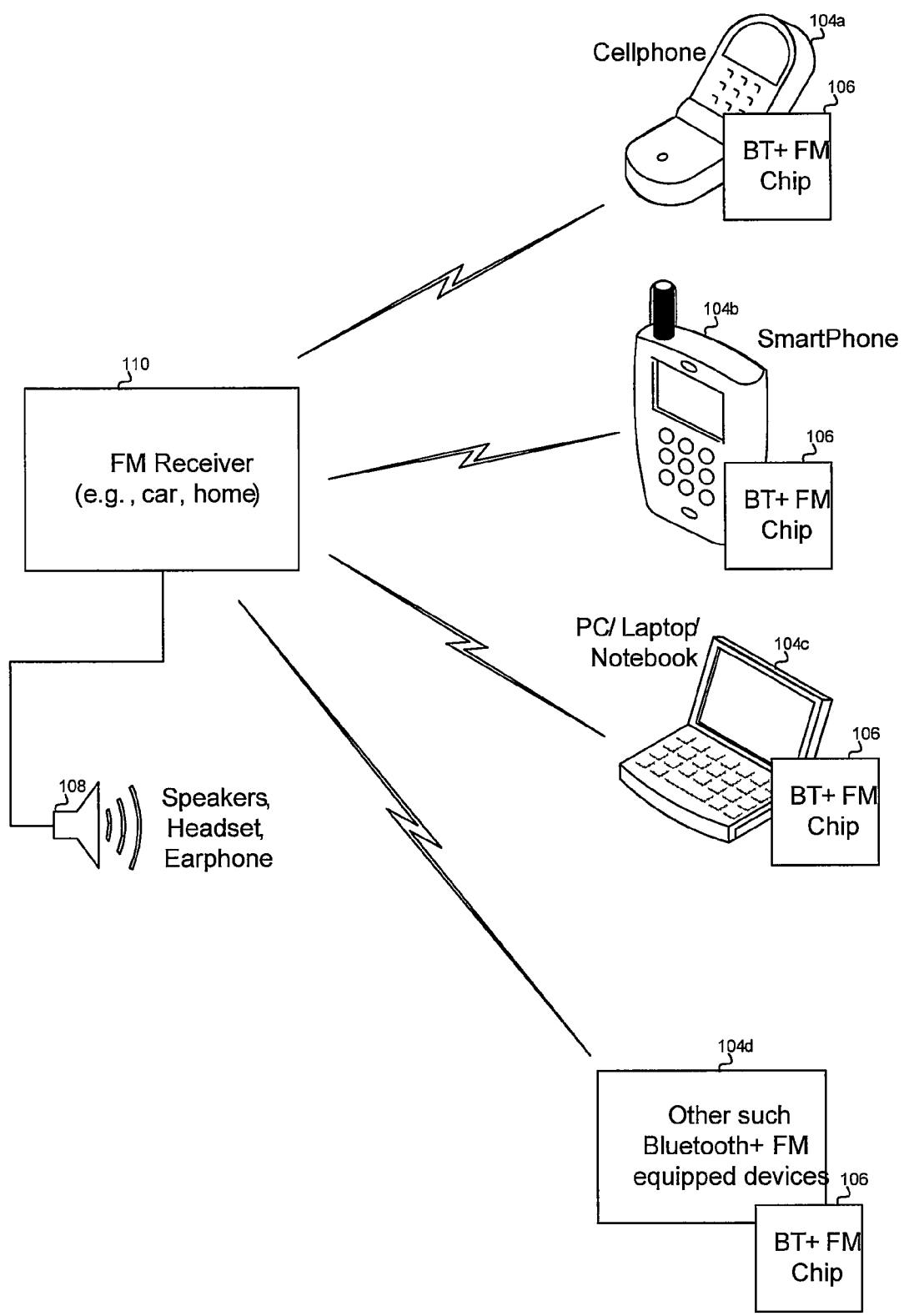
FIG. 1B is a block diagram of an exemplary integrated Bluetooth and FM receiver that communicates with devices transmitting a plurality of FM channels, in accordance with an embodiment of the invention.

FIG. 1B is a block diagram of an exemplary integrated Bluetooth and FM receiver that communicates with handheld devices that utilize a single chip with integrated Bluetooth and FM radios, in accordance with an embodiment of the invention. Referring to FIG. 1B, there is shown an FM receiver 110, the cellular phone 104a, the smart phone 104b, the computer 104c, and the exemplary FM and Bluetooth-equipped device 104d. In this regard, the FM receiver 110 may comprise and/or may be communicatively coupled to a listening device 108. A device equipped with the Bluetooth and FM transceivers, such as the single chip 106, may be able to broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines a Bluetooth and FM transceiver and/or receiver may be utilized in a plurality of other devices and/or systems that receive and use an FM signal.

The single chip 106 may comprise of an integrated clock generator, (to be discussed in FIG. 2), where the integrated clock generator may both function as a Bluetooth local oscillator (LO) and as a FM LO. The Bluetooth LO may generate clock signals to enable Bluetooth signals transmission and reception. The same Bluetooth LO clock signals may be used to drive a direct digital frequency synthesizer (DDFS) to generate FM LO clock signals to enable FM signals transmission.

Figure 1C:
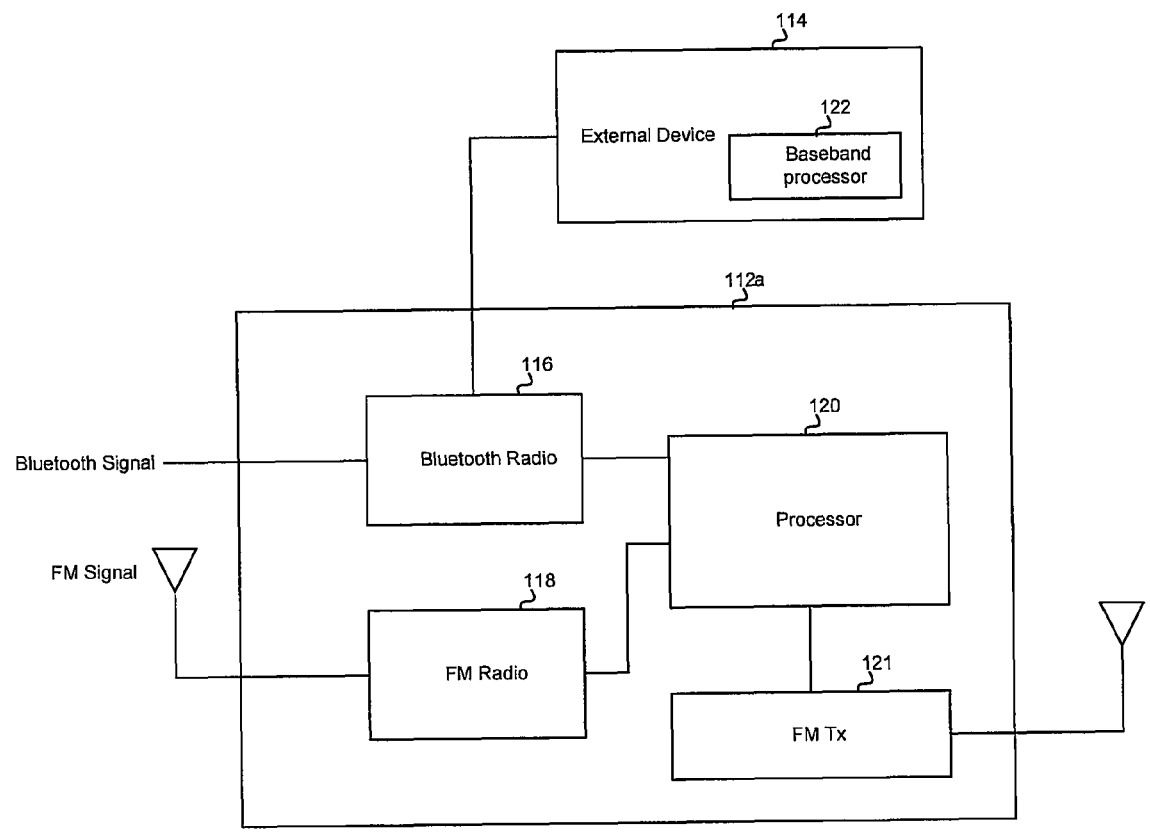
FIG. 1C is a block diagram of an exemplary single chip with integrated Bluetooth and FM radios that supports FM processing and an external device that supports Bluetooth processing, in accordance with an embodiment of the invention.

FIG. 1C is a block diagram of an exemplary single chip with integrated Bluetooth and FM radios that supports FM processing and an external device that supports Bluetooth processing, in accordance with an embodiment of the invention. Referring to FIG. 1C, there is shown a single chip 112a that supports Bluetooth and FM radio operations and an external device 114. The single chip 112a may comprise an integrated Bluetooth radio 116, an integrated FM radio 118, an integrated processor 120, and an FM transmitter (Tx). The Bluetooth radio 116 may comprise suitable logic, circuitry, and/or code that enable Bluetooth signal communication via the single chip 112a. In this regard, the Bluetooth radio 116 may support audio signals or communication. The FM radio may comprise suitable logic, circuitry, and/or code that enable FM signal communication via the single chip 112a.

The integrated processor 120 may comprise suitable logic, circuitry, and/or code that may enable processing of the FM data received by the FM radio 118. Moreover, the integrated processor 120 may enable processing of FM data to be transmitted by the FM radio 118 when the FM radio 118 comprises transmission capabilities. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120. The FM transmitter 121 may comprise suitable logic, circuitry, and/or that may enable transmission of FM signals via appropriate broadcast channels, for example.

The single chip 112a may comprise of an integrated clock generator (to be discussed in FIG. 2), where the integrated clock generator may both function as a Bluetooth local oscillator (LO) and as a FM LO. The Bluetooth LO may generate clock signals to enable Bluetooth signals transmission and reception. The same Bluetooth LO clock signals may be used to drive a direct digital frequency synthesizer (DDFS) to generate FM LO clock signals to enable FM signals transmission and reception.

Figure 2:
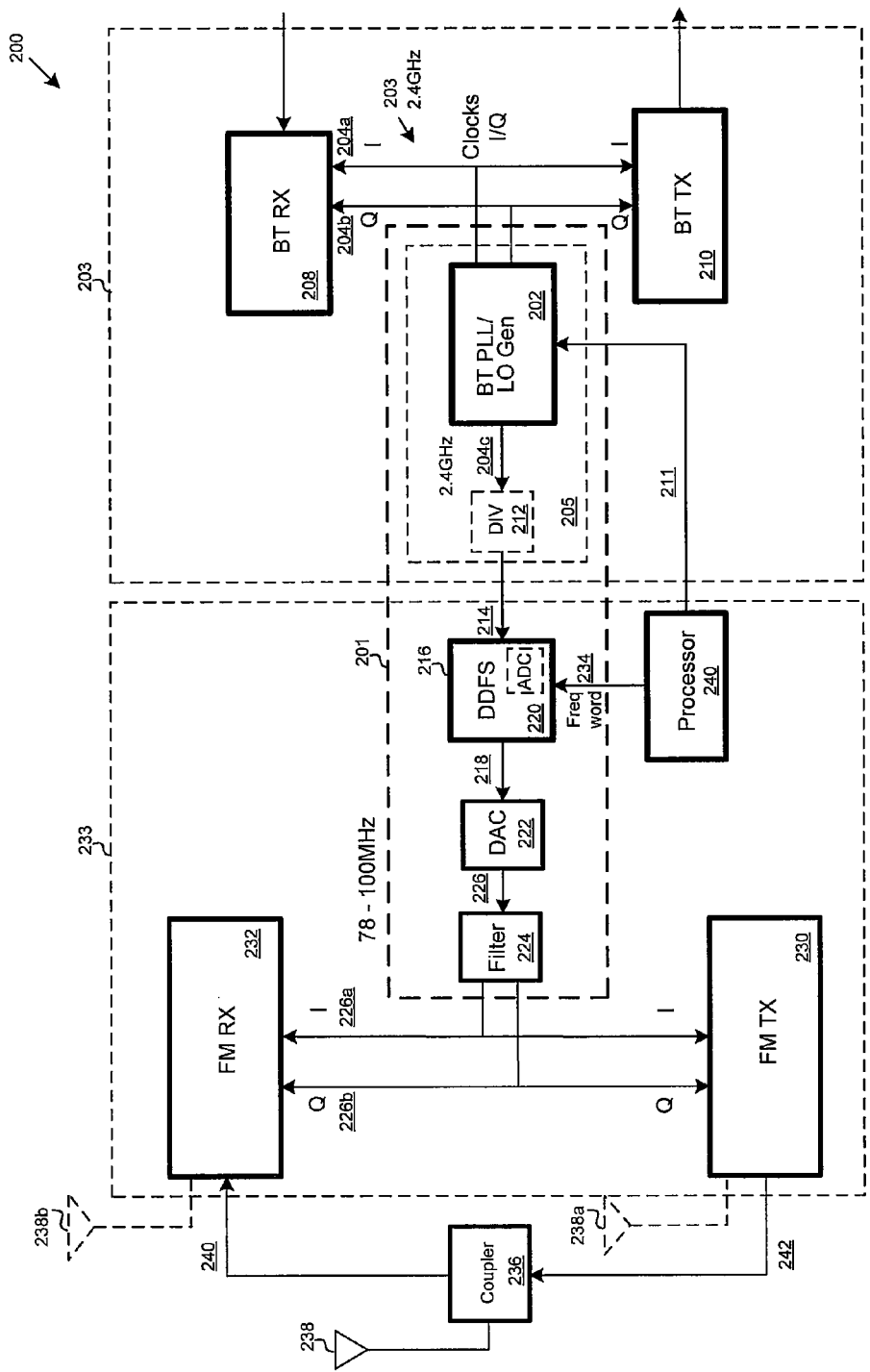
FIG. 2 is an exemplary block diagram of a Bluetooth and FM transmit and/or receive circuits using an integrated clock generator, in accordance with an embodiment of the invention.

FIG. 2 is an exemplary block diagram of a Bluetooth and FM transceivers using an integrated clock generator, in accordance with an embodiment of the invention. Referring to FIG. 2, there is shown an integrated clock generator 201 generating clock signals to a Bluetooth transceiver circuit 203 and a FM transceiver circuit 233, a bidirectional coupler 236 coupled to an antenna 238, in a wireless communication system 200.

The integrated clock generator 201 may comprise a BT phase locked loop (PLL) and LO generator (BT PLL/LOGEN) circuit 202, an optional divider 212, a DDFS 216, a DAC 222 and a filter 224. The Bluetooth transceiver 203 may comprise of a Bluetooth receiver circuit (BT RX) 208 and a Bluetooth transmitter circuit (BT TX) 210. The FM transceiver 233 may comprise of a FM receiver circuit (FM RX) 232 and a FM transmit circuit (FM TX) 230.

The BT RX 208, and FM RX 232 may each may comprise a mixer, one or more filters and amplifiers for the down conversion of the received carrier signals to an intermediate frequency for signal processing. Similarly, the BT TX 210 and FM TX 230 may each may comprise a mixer, one or more filters and amplifiers for the up conversion or direct transmission of modulated signals as transmit signals.

In an exemplary embodiment on the invention, the BT PLL/LOGEN circuit 202 may generate a 2.4 GHz clock signal 203a under a control tune signal 211 from processor 240. The BT PLL/LOGEN circuit 202a may output a quadrature clock signal comprising an In-phase (I) component 204a and a Quadrature-phase (Q) component 204b. The 2.4 GHz I and Q component signals 204a and 204b may be sent to a BT receiver (BT RX) circuit 208 and/or to a BT transmitter (BT TX) circuit 210.

The BT PLL/LOGEN circuit 202 may also the same 2.4 GHz clock signal as clock signal 204c, which may be sent to an optional divider circuit 212. The optional divider circuit 212 may be configurable to implement frequency division of the clock signal 204c received from the BT PLL/LOGEN circuit 202. The optional divider circuit 212 may receive the clock signal 204c from the BT PLL/LOGEN circuit 202a having a frequency, $f_{BT\_LO}$, and output a signal DIV 214 having a frequency $f_{DIV}$:

$$f_{DIV} = \frac{f_{BT\_LO}}{N} \qquad [1]$$

where N may represent a configurable scale factor utilized by the optional divider circuit 212. The optional divider circuit 212 may send the divided signal DIV 214 to a DDFS 216.

In another embodiment, the BT PLL/LOGEN circuit 202 may under the control tune signal 211 from the processor 240, generate other frequencies such as 1.6 GHz, 800 MHz to clock the DDFS 216 without the need of the optional divider circuit 212. In other embodiments, a fractional frequency synthesizer chip may be used to adjust the clock signal 214 without affecting the Bluetooth LO clock signals 204a and 204b. A lower spurious component in the output signal 226 may be obtained by using a clock frequency 214 several magnitudes higher than the output signals 218 of the DDFS 216.

The DDFS 216 may comprise suitable logic, circuitry and/or code that may enable reception of the DIV input signal 214 and subsequent generation of a sequence of binary numbers 218. The process of converting the DIV input signal 214 to a sequence of binary numbers 218 may comprise analog to digital conversion (ADC) 220 whereby each distinct voltage, current and/or power level associated with the received DIV signal 214 may be represented as a binary number selected from a plurality of binary numbers 218. Conversely, each binary number 218 may correspond to a range of voltage, current and/or power levels in the received DIV signal 214. An exemplary DIV signal 214 may be a sinusoidal signal for which the corresponding period may be equal to the inverse of the frequency, $(1/f_{DIV})$.

The number of binary numbers 218 in the plurality may be determined by the number of bits, b, contained in the binary number 218 representation. Each binary number 218 may comprise a least significant bit (LSB) and a most significant bit (MSB). In an exemplary numerical representation, the each of binary numbers 218 may have a value within the range 0 to $2^b-1$. The operation of the DDFS 216 may be such that a period of the received DIV signal 214 may be converted to binary sequence 0, 1, . . . , $2^b-1$, wherein upon reaching the value $2^b-1$ the next number in the binary sequence may be 0 with the sequence continuing. The set of numbers from 0 to $2^b-1$ may represent a period T of the binary sequence. The DDFS 216 may receive a frequency word $f_{Word}$ 234 from processor 240, upon which the value of b may be determined. Consequently, the period of the sequence of binary numbers generated by the DDFS 216 may be programmable based on the $f_{Word}$ 234.

The DAC 222 may comprise suitable logic, circuitry and/or code that may enable generation of an analog output signal 226 based on a received sequence of input binary numbers 218. The DAC 222 may generate a corresponding analog voltage level for each input binary number. The number of distinct analog voltage levels may be equal to the number of distinct binary numbers 218 in the input sequence.

The filter circuit 224 may comprise suitable logic, circuitry and/or code that may enable low pass filtering (LPF) of signal components contained in a received signal 226. The LPF 224 may enable smoothing of the received input signal 226 to attenuate amplitudes for undesirable frequency components contained in the received signal 226. The filter circuit 224 may generate a signal, FM_X having a frequency $f_{FM}$, in the FM frequency band. In an exemplary embodiment of the invention, the range of frequencies may comprise 78 MHz≦$f_{FM}$≦100 MHz. In other embodiments of the invention, the FM radio devices may operate at a wider frequency range such as between 60 to 130 MHz. The signal FM_X may be a quadrature signal comprising I and Q signal components 226a and 226b. The 78-100 MHz I and Q signals 226a and 226b may be sent to an FM TX circuit 230 and/or an FM RX circuit 232.

In an exemplary embodiment of the invention, the FM TX circuit 230 and FM RX circuit 232 may be coupled to an antenna 238 via a bidirectional coupler 236. The bidirectional coupler 236 may couple the antenna 238 to the FM RX circuit 232 at a given time instant under the control of a $f_{Word}$ 234 to the DDFS 216, such that the FM RX signal 240 may receive signals via the antenna 238. The bidirectional coupler 236 may couple the antenna 238 to the FM TX circuit 230 at a different time instant under the control of a different $f_{Word}$ 234 to the DDFS 216, such that the FM TX signal 242 may transmit signals via the antenna 238. In another exemplary embodiment of the invention, the FM TX circuit 230 may be coupled to a transmitting antenna 238a, while the FM RX circuit 232 may be coupled to a receiving antenna 238b.

In an embodiment of the invention, simultaneous transmission and reception of FM signals may be simulated by switching the $f_{Word}$ 234 to the DDFS 216 between transmission and reception between a plurality of values. When the $f_{Word}$ 234 to the DDFS 216 may be switched at a time division manner, the frequencies of the FM_X signals may change between FM transmission and reception and the bidirectional coupler 236 with the antenna 238 may be time division duplexed (TDD) for transmission and reception at two different frequencies through control word 335 (shown in FIG. 3).

In operation, the value $f_{Word}$ 234 may be selected to maintain an approximately constant frequency $f_{FM}$ 226a and 226b despite changes in that may occur in the signal $f_{BT\_LO}$ 204a or 204b, which may occur due to frequency hopping in the BT signal. The DDFS 216 may simultaneously maintain a substantially constant phase in the digitally tuned frequencies during the BT PLL/LOGEN circuit 202 switches between the BT transmit or receive frequencies (frequency hopping). The use of a DDFS 216 in the integrated clock generator 201 may substantially overcome the proximity interference by the BT PLL/LOGEN clock signals 204a and 204b to the generation of the FM LO clock signals 226a and 226b.

In various embodiments of the invention, the BT PLL/LOGEN circuit 202, optional divider circuit 212, DDFS circuit 216, DAC circuit 222, and/or filter circuit 224 may comprise a single LOGEN unit 201. The single LOGEN unit 201 may generate signals suitable for generation of Bluetooth LO signals 204a and 204b, and FM LO signals 226a and 226b.

Various embodiments of the invention may provide Bluetooth and FM local oscillator generation in an integrated clock unit 201 in a wireless communication System On a Chip (SOC) 200, having a BT PLL/LOGEN circuit 202 clocking a single direct digital frequency synthesizer DDFS 216, in association with Bluetooth and FM transmit and receive functions.

Figure 3:
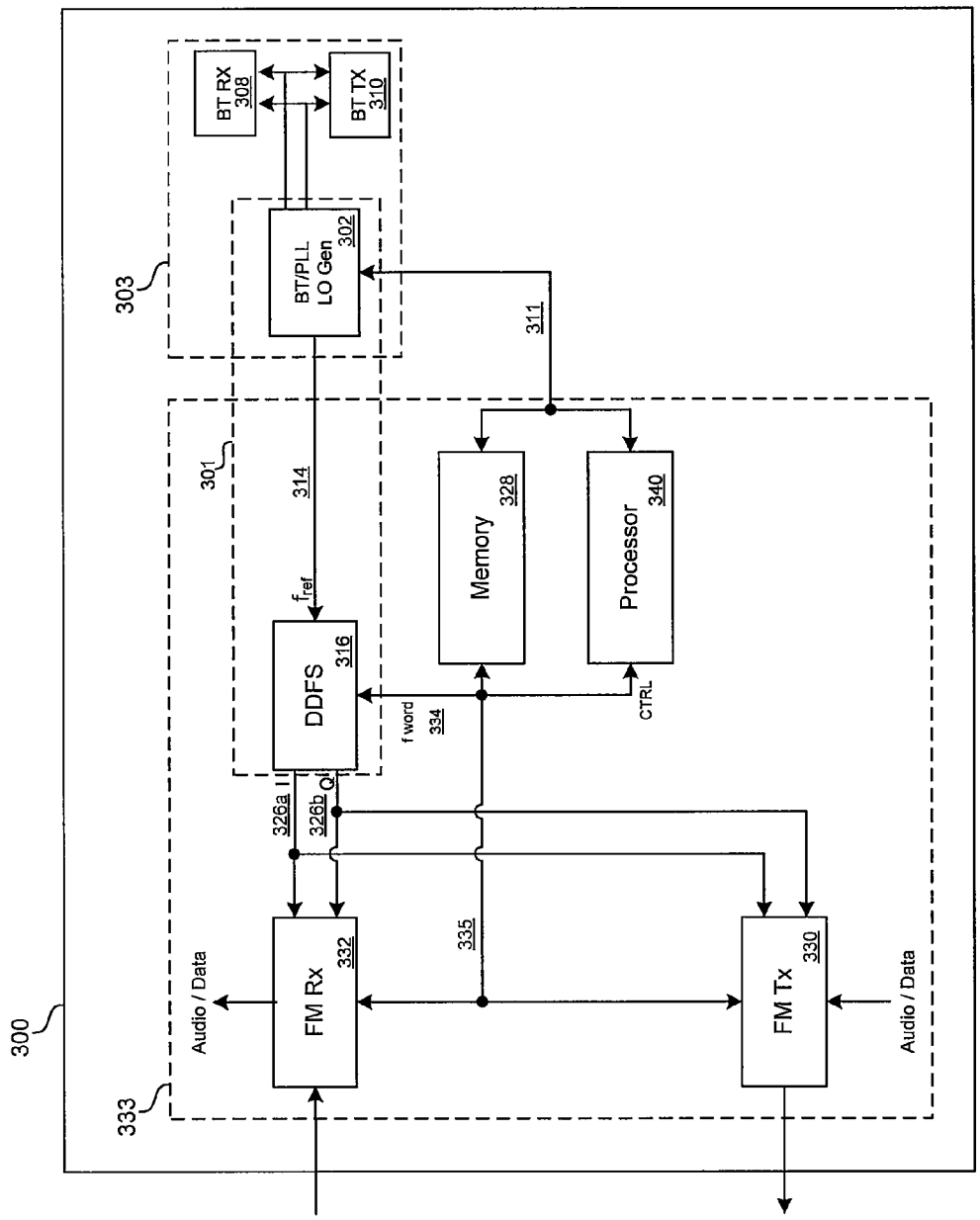
FIG. 3 is an exemplary diagram of a System on Chip (SOC) with integrated Bluetooth and FM transceiver circuits, in accordance with an embodiment of the invention.

FIG. 3 is an exemplary diagram of a wireless communication System on Chip (SOC) 300 with integrated BT transceiver 303 and FM transceiver 333, in accordance with an embodiment of the invention. Referring to FIG. 3, the SOC 300 may comprise a BT transceiver 303 and an FM transceiver 333 with an integrated clock generator 301.

The BT transceiver 303 may comprise a BT/PLL LOGEN circuit 302, a BT receiver circuit BT RX 308, a BT transmit circuit BT TX 310, suitable logic, circuitry, and/or code that may enable communicating with an external device 114 with a baseband processor 122 shown in FIG. 1C. In this regard, the BT transceiver 303 may be similar to or the same as the BT transceiver 203 disclosed in FIG. 2. Moreover, the BT transceiver 303 may comprise a BT PLL/LOGEN circuit 302 that may be similar to or the same as the BT PLL/LOGEN circuit 202 disclosed in FIG. 2.

Accordingly, the BT PLL/LOGEN circuit 302 may comprise a PLL utilized to generate a signal utilized in the communication of BT data. One or more control signals may be provided by the BT transceiver 303 to the processor 340 and/or the memory 328. Similarly, one or more control signals 311 may be provided by the memory 328 and/or the processor 340 to the BT transceiver 303. In this regard, digital information may be exchanged between the BT transceiver 303 and the FM transceiver 333. For example, changes in operating frequency of the BT PLL/LOGEN circuit 302 may be communicated to the memory 328 through control signal 311 and/or the processor 340 such that the frequency control word 334 to a DDFS 316 may be altered to compensate for the frequency change.

The FM transceiver 333 may comprise suitable logic, circuitry, and/or code that may enable the transmission and/or reception of FM signals. In this regard, the FM transceiver 333 may be similar to the FM transceiver 233 disclosed in FIG. 2. The FM transceiver 333 may comprise a DDFS 316 clocked by the BT PLL/LOGEN circuit 302. Accordingly, the FM transceiver 333 may be enabled to utilize reference generated clock signal 314 of widely varying frequency. In this regard, the DDFS 316 may enable utilizing the output reference generated clock signal 314 of the BT PLL/LOGEN circuit 302 to generate signals utilized by the FM transceiver 333. In this manner, a reduction in power consumption and circuit size may be realized in the SOC 300 by sharing a single BT PLL/LOGEN circuit 302 between the FM transceiver 333 and the BT transceiver 303.

In an exemplary operation of the system 300, one or more signals such as signals 335 provided by the processor 340 may configure the FM transceiver 333 to either transmit or receive FM signals. To receive FM signals, the processor 340 may provide one or more signals 335 to power up the FM Rx block 332 and power down the FM Tx block 330. Additionally, the processor 340 may provide a frequency control word 334 to the DDFS 316 in order to generate an appropriate FM LO frequency (with IQ components 326a and 326b) based on the reference signal $f_{ref}$ 314. In this regard, $f_{ref}$ 314 may comprise an output of the BT PLL/LOGEN circuit 302. For example, the BT PLL/LOGEN circuit 302 may operate at 900 MHz and the DDFS 316 may thus utilize the 900 MHz signal to generate, for example, signals in the "FM broadcast band", or approximately 78 MHz to 100 MHz. The FM broadcast band may expand to cover wider range such as 60 to 130 MHz in some FM radio devices.

The processor 340 may interface with the memory 328 in order to determine the appropriate state of any control signals and the appropriate value of the frequency control word 334 provided to the DDFS 316. To transmit FM signals the processor 340 may provide one or more signals 335 to power up the FM Tx block 330 and power down the FM Rx block 332. Additionally, the processor 340 may provide a frequency control word 334 to the DDFS 316 in order to generate an appropriate FM LO frequency (with IQ components 326a and 326b) based on the reference signal $f_{ref}$ 314. Alternatively, the processor 340 may provide a series of control words 334 to the DDFS 316 in order to generate a FM signal. In this regard, the processor 340 may interface with the memory 328 in order to determine the appropriate state of any control signals 335 and the appropriate values of the control word 334 provided to the DDFS 316.

Figure 4:
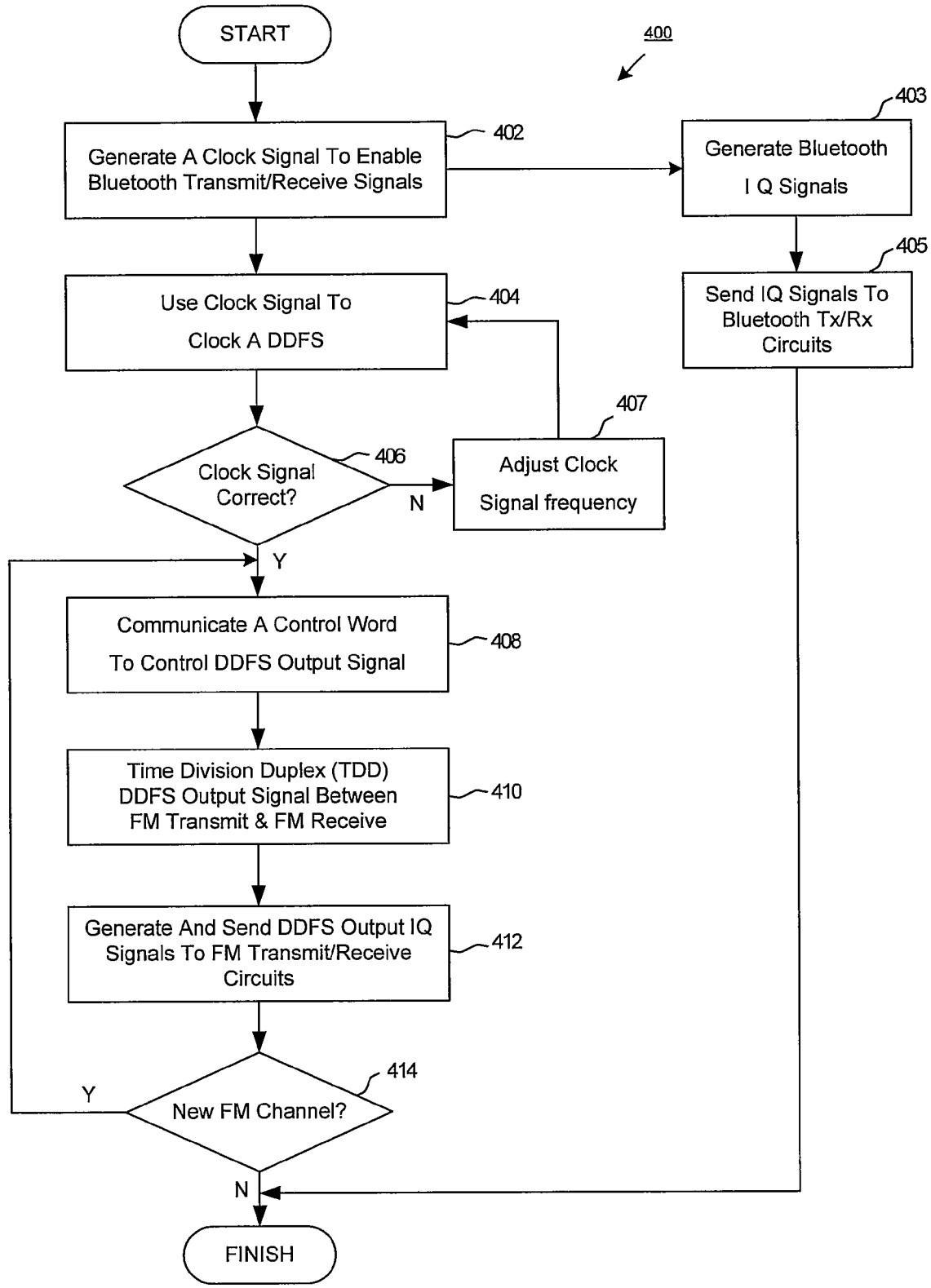
FIG. 4 is a flow chart illustrating a method of wireless communication using an integrated clock generator in a Bluetooth and FM transmit and/or receive circuits, in accordance with an embodiment of the invention.

FIG. 4 is a flow chart illustrating a method of wireless communication using an integrated clock generator in a Bluetooth and FM transmit and/or receive circuits, in accordance with an embodiment of the invention. In this regard, one or more of the exemplary step shown in FIG. 4 may be performed by a system such as the wireless communication system SOC 200 illustrated in FIG. 2. Referring to FIG. 4, subsequent to a start step, in step 402 an appropriate frequency of a clock signal generated for BT wireless communications may be determined. For example, at start-up, the processor 240 described in FIG. 2 may read a default frequency setting from an internal memory.

At step 402, generate a clock signal to enable Bluetooth transmit/receive signals. A default Bluetooth clock signal at exemplary Bluetooth frequencies such as 2.4 GHz, 1.6 GHz, 1.2 GHz, 900 MHz or 800 MHz may be generated by the BT/PLL LOGEN circuit 202 to enable transmit or receive signals. At step 403, generate Bluetooth IQ signals, an in phase I signal 204a and a quadrature phase Q signal 204b. At step 405, send IQ signals to Bluetooth Tx/Rx circuits. The I signal 204a and a quadrature phase Q signal 204b are sent to the BT Tx circuit 210 and BT Rx circuit 208 where BT wireless communication is completed or established with an external device such as a wireless head set or a cell phone.

At step 404, use clock signal to clock a DDFS 216. The same clock signal 214 at the Bluetooth LO frequency may be used as a reference signal to clock the DDFS 216. At step 406, the clock signal 214 may be checked if too high or too low. At step 407, adjust clock signal frequency. In an embodiment, the Bluetooth clock signal frequency such as 2.4 GHz or 1.6 GHz may be too high to clock the DDFS 216. Adjustment may be made in several ways, to use a divider circuit 212 to divide a 2.4 GHz clock signal to a 1.2 GHz clock signal, or to communicate a control signal from the processor 240 to tune the BT/PLL LOGEN circuit 202. In other embodiments, a fractional frequency synthesizer chip may be used to adjust the clock signal 204c without affecting the Bluetooth LO clock signals 204a and 204b.

At step 408, communicate a control word to control DDFS output signal. The DDFS 216 may receive a frequency control word 234 from the processor 240 to tune to a DDFS an output signal 226. The DDFS output signal 225 may be used as a FM LO signal after filtering and separation into in phase I signal 226a and quadrature phase Q signal 226b. At step 410, time division duplex (TDD) DDFS output signal between FM transmit and FM receive. The LO frequencies for the FM transmit circuit and FM receive circuit may differ. Therefore, the DDFS 216 may receive a plurality of control words 234 from the processor 240 that switch between generating a transmit FM LO frequency and a receive FM LO frequency. The switching may be at a high rate such that the DDFS 216 output signal 226 may appear simultaneously generating the transmit and receive FM LO frequencies at a time division duplex manner.

At step 412, generate and send DDFS output IQ signals to FM transmit/receive circuits. DDFS output with in phase I signal 226a and a quadrature Q signal 226b may be generated through frequency word control 234 from the processor 240. Both the FM TX circuit 230 and FM RX circuit 232 may be driven by the IQ output signals 226a and 226b at respective DDFS output signals 226. At step 414, determine if new FM channels may be required for new tuning. If a new channel tuning is required, a new command word 234 from the processor 240 may be communicated to the DDFS 216 by repeating step 406. If not, the tuning process terminates.

In accordance with various embodiments of the invention, the method 400, and system 200 for wireless communication using an integrated clock generator 201 for Bluetooth 210, 208 and FM transmit and receive 230 and 232 functions are provided. The method may comprise using an integrated clock generator 201 with a BT PLL/LOGEN circuit 202 to generate clock signals as BT LO clock signals in IQ quadrature 204a, 204b to enable transmission and/or reception of Bluetooth signals. The clock signals in IQ quadrature 204a and 204b may be periodically changed (frequency hopping) between a frequency for Bluetooth transmission and a frequency for Bluetooth reception.

An output of the same clock signal 204c may be used to clock a DDFS 216 to generate IQ quadrature signals 226a and 226b by the DDFS 216 that enable transmission or reception of FM signals. The clock signal 204c may be adjusted in frequency to a clock signal 214 such as using an optional divider circuit 212 or through tuning the BT PLL/LOGEN circuit 202 using control tune signal 211. The IQ quadrature signals 226a and 226b by the DDFS 216 may be adjusted for FM transmission or FM reception by changing the frequency control word 234.

Simultaneous FM transmission and FM reception may be simulated by switching the frequency control word 234 between a plurality of values, such as switching between the frequency control word 234 for FM transmission LO frequency for an instant and for FM reception LO frequency for another instant through time division duplexing. The frequency control word 234 may be adjusted to maintain a substantially constant FM LO frequencies with minimal phase jump to compensate for changes in the clock signals 204c. The FM transmit and receive functions may be through coupling a FM transmit circuit 230 and a receive circuit 232 to a bidirectional coupler. The integrated clock generator circuit 201 may be integrated on a single chip or implemented using discrete components.

Another embodiment of the invention may provide a machine-readable storage, having stored thereon, a computer program having at least one code section executable by a machine, thereby causing the machine to perform the steps as described herein for wireless communication using integrated clock generation for Bluetooth, FM transmit and FM receive functions.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a)

conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for wireless communication, the method comprising:
    generating a clock signal from an integrated clock generator to enable transmission and/or reception of Bluetooth signals; and
    clocking a Direct Digital Frequency Synthesizer (DDFS) via said generated clock signal to generate one or more signals by said DDFS that enable transmission or reception of FM signals.

2. The method according claim 1, wherein said generated clock signal that enable said transmission and/or reception of said Bluetooth signals comprises an in phase component and a quadrature phase component.

3. The method according to claim 1, comprising generating said clock signal via phase locked local oscillator.

4. The method according to claim 1, comprising controlling said transmission or reception of said FM signals via a bi-directional coupler.

5. The method according to claim 1, comprising adjusting a frequency of said generated clock signal that is utilized for said clocking of said DDFS.

6. The method according to claim 1, comprising communicating a control word that controls said generation of said one or more signals by said DDFS.

7. The method according to claim 6, comprising simulating simultaneous FM transmission and FM reception by switching said generated control word between a plurality of values.

8. The method according to claim 6, comprising switching said control word input to said DDFS between a plurality of values in successive time intervals to perform time division duplexing (TDD) of said FM transmission and said FM reception.

9. The method according to claim 8, wherein said TDD of said FM transmission occurs at a first frequency and said TDD of said FM reception occurs at a second frequency.

10. The method according to claim 1, comprising adjusting a control word input to said DDFS to compensate for changes in said generated clock signal.

11. A system for wireless communication, the system comprising:
    an integrated clock generator that comprises one or more circuits that generate a clock signal to enable transmission and/or reception of Bluetooth signals; and
    said one or more circuits of the said integrated clock generator clocks a Direct Digital Frequency Synthesizer (DDFS) via said generated clock signal to generate one or more signals by said DDFS that enable transmission or reception of FM signals.

12. The system according claim 11, wherein said generated clock signal that that enable said transmission and/or reception of said Bluetooth signals comprises an in phase component and a quadrature phase component.

13. The system according to claim 11, wherein said one or more circuits comprise a phase locked local oscillator that generates said clock signal.

14. The system according to claim 11, wherein said one or more circuits control said transmission or reception of said FM signals via a bi-directional coupler.

15. The system according to claim 11, wherein said one or more circuits adjust a frequency of said generated clock signal that is utilized for said clocking of said DDFS.

16. The system according to claim 11, wherein said one or more circuits communicate a control word that controls said generation of said one or more signals by said DDFS.

17. The system according to claim 16, wherein said one or more circuits simulates simultaneous FM transmission and FM reception by switching said generated control word between a plurality of values.

18. The system according to claim 16, wherein said one or more circuits switch said control word input to said DDFS between a plurality of values in successive time intervals to perform time division duplexing of said FM transmission and said FM reception.

19. The system according to claim 18, wherein said TDD of said FM transmission occurs at a first frequency and said TDD of said FM reception occurs at a second frequency.

20. The system according to claim 11, wherein said one or more circuits adjusts a control word input to said DDFS to compensate for changes in said generated clock signal.

21. A non-transitory computer-readable medium having stored thereon, a computer program having at least one code section for wireless communication, the at least one code section being executable by a machine for causing the machine to perform steps comprising generating a clock signal from an integrated clock generator to enable transmission and/or reception of Bluetooth signals; and clocking a Direct Digital Frequency Synthesizer (DDFS) via said generated clock signal to generate one or more signals by said DDFS that enable transmission or reception of FM signals.

22. The non-transitory computer-readable medium according to claim 21, wherein said generated clock signal that enables said transmission and/or reception of said Bluetooth signals comprises an in phase component and a quadrature phase component.

23. The non-transitory computer-readable medium according to claim 21, wherein said at least one code section comprises code for generating said clock signal via phase locked local oscillator.

24. The non-transitory computer-readable medium according to claim 21, wherein said at least one code section comprises code for controlling said transmission or reception of said FM signals via a bi-directional coupler.

25. The non-transitory computer-readable medium according to claim 21, wherein said at least one code section comprises code for adjusting a frequency of said generated clock signal that is utilized for said clocking of said DDFS.

26. The non-transitory computer-readable medium according to claim 21, wherein said at least one code section comprises code for generating a control word that controls said generation of said one or more signals by said DDFS.

27. The non-transitory computer-readable medium according to claim 26, wherein said at least one code section comprises code for simulating simultaneous FM transmission and FM reception by switching said generated control word between a plurality of values.

28. The non-transitory computer-readable medium according to claim 26, wherein said at least one code section comprises code for simulating simultaneous FM transmission and FM reception by switching said generated control word between a plurality of values.

29. The non-transitory computer-readable medium according to claim 28, wherein said TDD of said FM transmission occurs at a first frequency and said TDD of said FM reception occurs at a second frequency.

30. The non-transitory computer-readable medium according to claim 21, wherein said at least one code section comprises code for adjusting a control word input to said DDFS to compensate for changes in said generated clock signal.

* * * * *